United States Patent
Oda et al.

(10) Patent No.: US 6,489,668 B1
(45) Date of Patent: *Dec. 3, 2002

(54) SEMICONDUCTOR DEVICE AND METHOD FOR MANUFACTURING THE SAME

(75) Inventors: Zenzo Oda, Chino (JP); Tadashi Komiyama, Kofu (JP); Toshinori Nakayama, Sakata (JP); Osamu Omori, Sakata (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/194,065

(22) PCT Filed: Mar. 10, 1998

(86) PCT No.: PCT/JP98/00974

§ 371 (c)(1),
(2), (4) Date: May 26, 1999

(87) PCT Pub. No.: WO98/43288

PCT Pub. Date: Oct. 1, 1998

(30) Foreign Application Priority Data

Mar. 24, 1997 (JP) ............................................. 9-070245

(51) Int. Cl.[7] ............................................. H01L 23/495
(52) U.S. Cl. ........................ 257/675; 257/676; 257/706; 257/707; 257/720; 257/780; 257/784
(58) Field of Search ............................... 257/707, 713, 257/706, 720, 780, 784, 675, 676, 680, 698; 438/122, 121; 361/704, 709, 711

(56) References Cited

U.S. PATENT DOCUMENTS

| | | | |
|---|---|---|---|
| 4,698,663 A | * 10/1987 | Sugimoto et al. ............. | 357/81 |
| 5,048,179 A | 9/1991 | Shindo et al. | |
| 5,367,193 A | * 11/1994 | Malladi ....................... | 257/707 |
| 5,455,457 A | * 10/1995 | Kurokawa ................... | 257/712 |
| 5,561,323 A | * 10/1996 | Andros et al. ............... | 257/707 |
| 5,729,435 A | * 3/1998 | Iijima et al. ................. | 361/704 |
| 5,744,863 A | * 4/1998 | Culnane et al. .............. | 257/712 |
| 5,767,446 A | * 6/1998 | Ha et al. .................... | 174/52.4 |
| 5,818,699 A | * 10/1998 | Fukuoka ...................... | 361/760 |
| 5,835,988 A | * 11/1998 | Ishii ........................... | 257/684 |

FOREIGN PATENT DOCUMENTS

| | | |
|---|---|---|
| GB | 2 186 577 | 8/1987 |
| JP | 51-014 268 A | 2/1976 |
| JP | A-51-76971 | 7/1976 |
| JP | A-2-5534 | 1/1990 |
| JP | A-3-257854 | 11/1991 |
| JP | A-4-3946 | 1/1992 |
| JP | A-4-123442 | 4/1992 |
| JP | 04-152 642 A | 5/1992 |
| JP | A-5-29502 | 2/1993 |
| JP | A-5-102338 | 4/1993 |
| JP | 408008388 A * | 1/1996 |
| JP | 408008388 * | 1/1996 |
| JP | A-8-83878 | 3/1996 |
| JP | A-8-172142 | 7/1996 |
| JP | A-8-288316 | 11/1996 |
| WO | WO 88/03705 | 5/1988 |

* cited by examiner

*Primary Examiner*—Kamard Cuneo
*Assistant Examiner*—Luan Thai
(74) *Attorney, Agent, or Firm*—Oliff & Berridge, PLC

(57) ABSTRACT

The present invention is a semiconductor device which can improve the adhesive force between a semiconductor chip substrate. This semiconductor device 60 has a semiconductor chip 18, a die pad (metallic portion) 16 on which the semiconductor chip 18 is fixedly mounted and supported through an adhesive layer 62, and a sealing resin 24 for sealing the die pad 16 and semiconductor chip 18. The adhesive layer 62 includes a plurality of conductive adhesive regions 66 and a plurality of insulative adhesive regions 64 together.

4 Claims, 10 Drawing Sheets

SEMICONDUCTOR DEVICE AND METHOD FOR MANUFACTURING THE SAME

TECHNICAL FIELD

The present invention relates to a semiconductor device and method of making the semiconductor device.

BACKGROUND ART

In the conventional semiconductor devices, generally, a semiconductor chip is bonded onto a printed board (substrate) through an adhesive. A circuit pattern formed on the board is wire-bonded to the electrodes of the semiconductor chip. The semiconductor chip is sealed by a thermoplastic resin such as epoxy resin.

For the purpose of enabling the backside of the semiconductor chip to use as a ground potential or causing the heat from the semiconductor chip to dissipate in an efficient manner, there is a semiconductor device in which the semiconductor chip is fixedly mounted on a die pad formed by a copper foil superior both in electrical and thermal conductivities.

However, as an adhesive, such a semiconductor device uses a conductive paste comprising an epoxy resin and a filler of powdered silver added thereto. Since adhesion of the conductive paste is inferior to that of an insulative paste, the former cannot provide a sufficient adhesion. Thus, the semiconductor chip may undesirably be separated from the die pad.

Recently, there has been developed a semiconductor device comprising a package board of copper plate on which a semiconductor chip is fixedly mounted in order to improve the thermal dissipation, because the amount of heat generated by the semiconductor chip has been increased due to the increased processing speed and density in the semiconductor device.

In such a semiconductor device, the semiconductor chip is adhered directly to the copper plate. Thus, the semiconductor chip may be separated from the copper plate due to the difference in thermal expansion coefficient between the semiconductor chip and the copper plate, as in the reflow to the printed board of an electronic device. More particularly, the coefficient of linear expansion in the silicon forming the semiconductor chip is about $2.4 \times 10^{-6}$/deg. while that of the copper is about $1.7 \times 10^{-5}$/deg., resulting in one-digit difference therebetween. Therefore, a remarkably large difference of thermal deformation (or thermal expansion) will be produced between the semiconductor chip and the copper plate due to an increased heat in the reflow. This will causes a large thermal stress to act on the adhesive, leading to separation of the semiconductor chip.

Thus, the conventional semiconductor devices raised a problem with respect to the adhesive property between the semiconductor chip and the substrate.

To overcome such a problem in the prior art, an object of the present invention is to provide a semiconductor device which can improve the adhesion between the semiconductor chip and the substrate and a method of making such a semiconductor device.

DISCLOSURE OF THE INVENTION (1) A semiconductor device according to the present invention comprises a semiconductor chip, a metallic portion on which the semiconductor chip is fixedly mounted and supported through an adhesive layer, the adhesive layer including a plurality of electrically conductive adhesive regions and a plurality of insulative adhesive regions together, and a resin for sealing the metallic portion and semiconductor chip.

The electrically conductive and insulative adhesive regions can easily be formed by electrically conductive and insulative adhesives arranged in an alternate and matrix pattern. The ratio of the electrically conductive adhesive regions to the insulative adhesive regions may be about 1:1.

According to the semiconductor device of the present invention which includes the conductive and insulative adhesive regions together, the semiconductor chip can firmly be fixed to the metallic portion by the insulative adhesive regions while at the same time the semiconductor chip can electrically be connected to the metallic portion by the conductive adhesive regions. In addition, the conductive adhesive can provide a superior heat dissipation since it contains as a filler a metal such as silver which is superior in thermal conductivity and thus can rapidly transmit the heat from the semiconductor chip to the metallic portion through the conductive adhesive regions. When the conductive and insulative adhesive regions are alternately arranged in a matrix pattern, the entire semiconductor chip can uniformly dissipate the heat and also provide a uniformly strong adhesion over the whole area. This can prevent an accident such as partial separation of the semiconductor chip from the metallic portion or other accident. When the proportion of the electrically conductive adhesive regions to the insulative adhesive regions is set to be about 1:1, a large adhesion can be provided with sufficient electrical and thermal conductivities.

(2) The semiconductor device of the present invention comprises a semiconductor chip, and a package board on which the semiconductor chip is fixedly mounted, the package board being formed of a metal plate, and the semiconductor chip being fixedly mounted on the metal plate through a thermal stress relaxation layer. The thermal stress relaxation layer may be an insulation film on which a wiring pattern is formed, or a resin such as a solder resist film. The metal plate may be phosphor deoxidized copper superior in electrical and thermal conductivities, such as C1220-(½) H or C1220-H defined by JIS.

Since in the semiconductor device of the present invention, the semiconductor chip is adhered to the metal plate which is the package board through the thermal stress relaxation layer, the thermal stress acting on the adhesive layer due to the difference in thermal expansion coefficient between the semiconductor chip and the metal plate can be absorbed and relaxed by the thermal stress relaxation layer. Thus, the semiconductor chip can be prevented from being separated from the metal plate under destroy of the adhesive layer. Since the metal plate is formed of more rigid phosphor deoxidized copper defined as C1220-(½)H or C1220-H by JIS, the metal (copper) plate can be made thinner than the prior art. Thus, the semiconductor device can be made thinner.

(3) The semiconductor device of the present invention comprises a semiconductor chip, a metallic package board on which the semiconductor chip is fixedly mounted, and an insulating film formed between the semiconductor chip and the package board. Each of the package board and insulating film. has at least one hole at part of an area fixed to the semiconductor chip. The hole may be sized such that an opened end thereof is fixedly mounted only on an outer periphery of the semiconductor chip. The semiconductor device may further comprise a radiator fixedly mounted on the semiconductor chip inside the hole and without contact to the opened end of the hole. The package board may have a coefficient of thermal expansion lower than that of the radiator, and the radiator may have a thermal conductivity higher than that of the package board. For example, the package board may be formed of iron and the radiator may be formed of copper.

Since the semiconductor device of the present invention has holes formed in the package board and insulating film, the area to be fixed to the semiconductor chip is reduced. Thus, a stress resulting from the difference in thermal expansion coefficient between the package board and the semiconductor chip is less transmitted to the semiconductor chip. In addition, the semiconductor chip can be prevented from being separated from the package board or being cracked. It is more effective that these holes are enlarged to secure the package board only to the outer periphery of the semiconductor chip. In such a case, any increased stress will not be produced since the radiator is smaller than the semiconductor chip even if the radiator is fixedly mounted in the holes. Generally, a material of higher thermal conductivity is also higher in coefficient of thermal expansion. However, the radiator fixedly mounted in the holes may be formed by any other suitable material. Particularly, if the radiator is formed of a material having its thermal conductivity higher than that of the package board, the stress is reduced while at the same time the heat radiation is increased. For example, the package board may be formed of iron and the radiator may be formed of copper.

(4) The semiconductor device of the present invention comprises a semiconductor chip, a metallic package board on which the semiconductor chip is fixedly mounted, and a sealing portion for sealing the semiconductor chip, the semiconductor chip being fixedly mounted on the package board through the same material as that of the sealing portion.

In the semiconductor chip of the present invention, the member fixedly connecting the package board to the semiconductor chip is formed of the same material as that of the sealing portion for sealing the semiconductor chip. More particularly, the semiconductor chip is covered with the material forming the sealing portion, including the interface between the semiconductor chip and the package board. Thus, the stress from the package board is dispersed also to the member forming the sealing portion. Therefore, the stress exerted to the semiconductor chip is relaxed. This prevents the semiconductor chip from being separated from the package board or being cracked.

(5) The semiconductor device of the present invention comprises a semiconductor chip, a first metallic package board on which the semiconductor chip is fixedly mounted, and a second metallic package board having an opening. The semiconductor chip is positioned in the opening of the second package board, and the second package board has its thermal conductivity higher than that of the first package board. The first package board has its thermal expansion coefficient lower than that of the second package board and is fixedly mounted on an edge of the opening in the second package board through a thermally conductive adhesive member. For example, the first package board may be formed of iron and the second package board may be formed of copper.

Since in the semiconductor device of the present invention, the first package board on which the semiconductor chip is fixedly mounted has its thermal expansion coefficient lower than that of the second package board, the stress exerted to the semiconductor chip is reduced. The heat radiation is improved since the second package board has its thermal conductivity higher than that of the first package board. Such a design may be provided by the fact that the first package board is formed of iron and the second package board is formed of copper.

(6) The present invention further provides a method of making the aforementioned semiconductor device, comprising a step of fixedly mounting a semiconductor chip on a metallic portion through an adhesive, such a step further comprising steps of simultaneously injecting an electrically conductive adhesive and an insulative adhesive onto the metallic portion through a plurality of nozzles and curing the adhesives while they are brought into contact with the semiconductor chip. The nozzles for injecting the electrically conductive and insulative adhesives may alternately be arranged in a matrix pattern.

In this method, the conductive and insulative adhesive regions can simultaneously be arranged over the metallic portion by injecting the conductive and insulative adhesives through the multiple nozzles. This can be performed by a single step, resulting in reduction of the manufacturing cost.

BEST MODE FOR CARRYING OUT THE INVENTION

Some preferred embodiments of a semiconductor device and method of making such a semiconductor device according to the present invention will now be described with reference to the accompanying drawings.

First Embodiment

Figure 1:
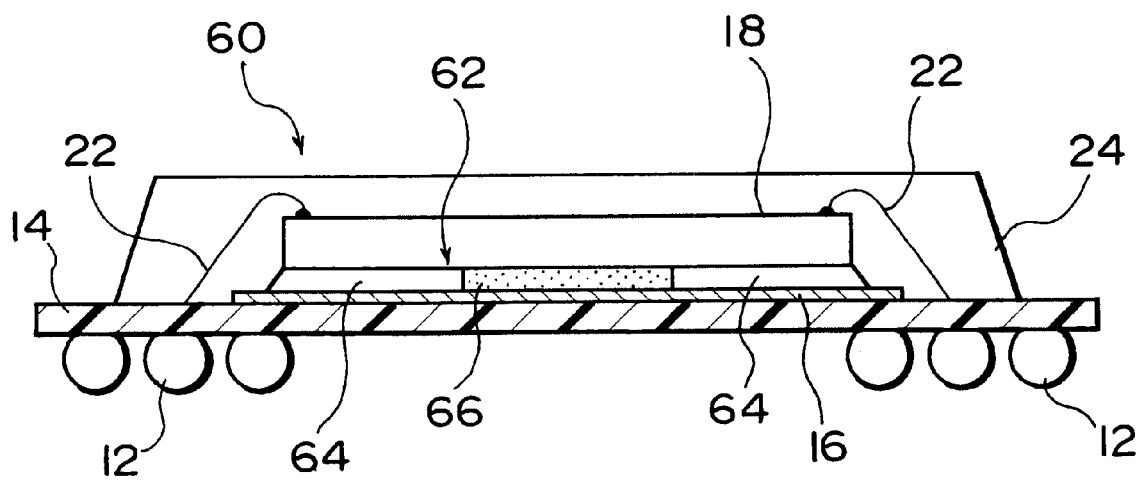
FIG. 1 is a cross-sectional view of the first embodiment of the semiconductor device of the present invention.
Figure 2:
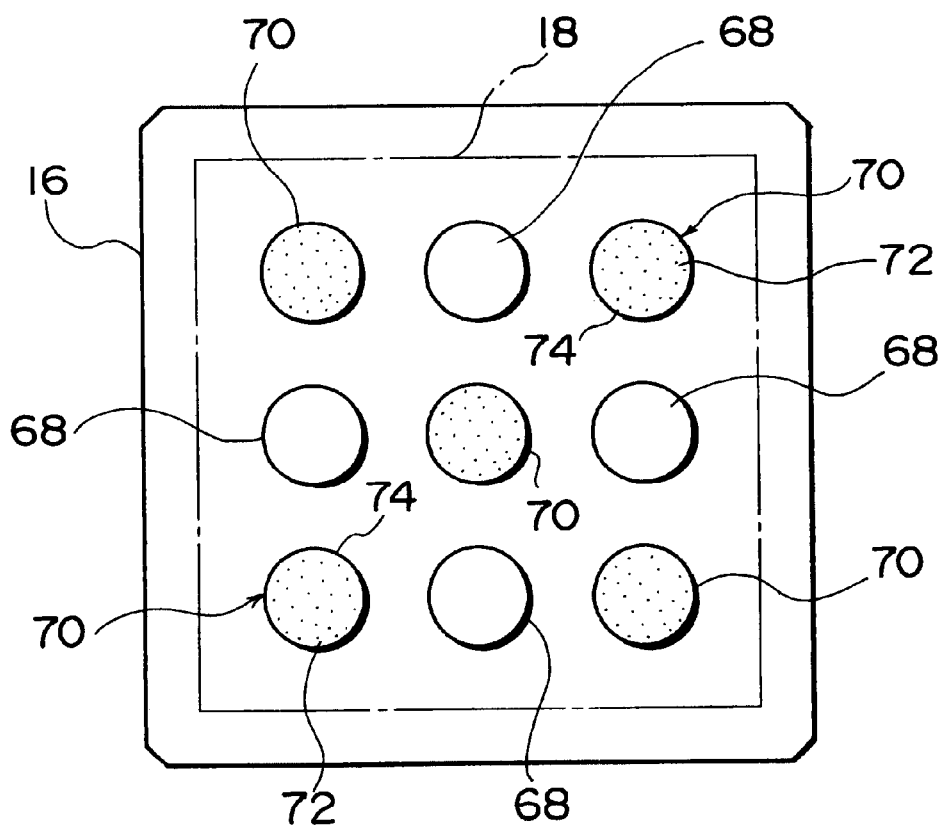
FIG. 2 is a plan view illustrating the arrangement of insulative and conductive pastes for respectively forming insulative and conductive adhesive regions in the first embodiment.

FIG. 1 is a cross-sectional view of the first embodiment of the semiconductor device according to the present invention and FIG. 2 is a plan view illustrating a state of adhesive application.

A semiconductor device 60 is of so-called ball grid array (BGA) type wherein solder balls 12 used as source, ground and signal terminals are arranged in a matrix pattern.

The semiconductor device 60 comprises a die pad 16 of copper foil that is centrally located on the top face of a printed circuit board 14. A semiconductor chip 18 is further disposed on the top face of the die pad 16.

The top and bottom faces of the printed board 14 include circuit patterns (not shown) formed thereon from copper foils. The electrode (pad) portion of the semiconductor chip 18 is electrically connected to the circuit pattern on the top face of the printed board 14 through gold wires 22. The printed board 14 is wire-bonded before the semiconductor chip 18 is sealed by a sealing resin 24 such as an epoxy resin. The circuit pattern on the bottom face of the printed board 14 is connected to the solder balls 12 being terminals.

The semiconductor chip 18 is bonded to the die pad 16 through an adhesive layer 62 which comprises insulative adhesive regions 64 and electrically conductive adhesive regions 66. As shown in FIG. 2, the insulative and conductive adhesive regions 64, 66 are formed by alternately arranging insulative and conductive adhesive pastes 68, 70. The insulative paste 68 may be made of an insulative resin such as an epoxy resin while the conductive paste 70 may be formed by mixing a filler 72 of powdered metal superior in electrical and thermal conductivities, such as silver, into an insulative resin 72 such as an epoxy resin. Four insulative paste lumps 68 and five conductive paste lumps 70 are alternately disposed on the die pad 16 in a matrix pattern.

Such a semiconductor device 60 is formed as follows. First, the die pad 16 made of copper foil is mounted on the top face of the printed board 14 including a given circuit pattern through vapor deposition or plating. Subsequently, a given amount of the insulative and conductive pastes 68, 70 are alternately disposed on the top face of the die pad 16 in a matrix pattern. The matrix of the insulative and conductive pastes 68, 70 can be formed as follows.

Figure 3:
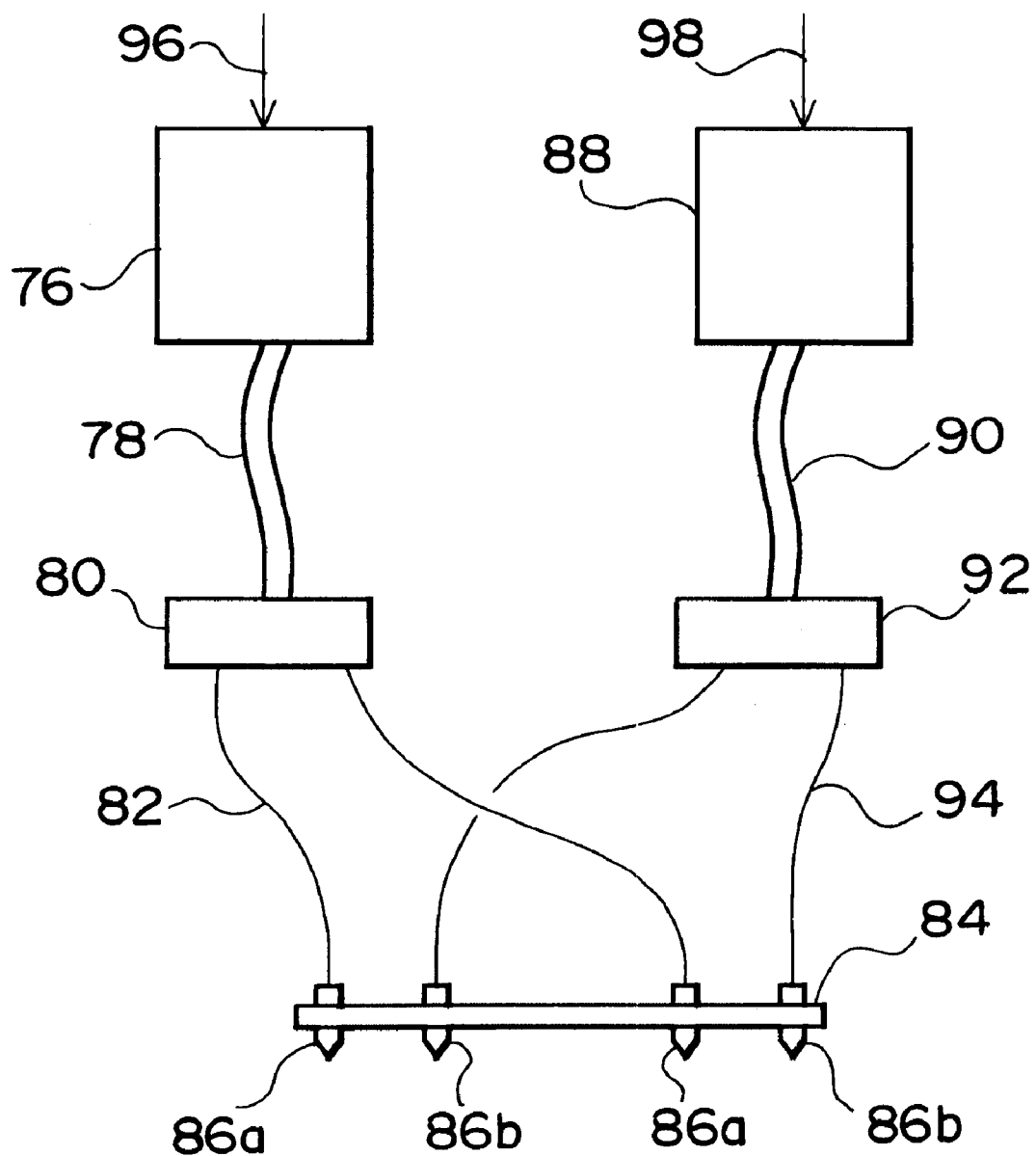
FIG. 3 is a view illustrating a process of arranging the insulative and conductive pastes in the method of making the semiconductor device according to the first embodiment.

As shown in FIG. 3, an insulative paste syringe 76 containing the insulative paste 68 is connected to a manifold 80 through a supply pipe 78. The outlet side of the manifold 80 is connected to nozzles 86a through a plurality of branch pipes 82, the nozzles 86a being held by a nozzle holder 84. Similarly, a conductive paste syringe 88 is connected to a manifold 92 through a supply pipe 90, and the manifold 92 is in turn connected to nozzles 86b through branch pipes 94. The nozzles 86a and 86b are alternately arranged in a matrix pattern with a given spacing therebetween. As shown by arrows 96 and 98 in FIG. 3, for example, compressed air may be simultaneously supplied to the syringes 76 and 88 to inject the insulative and conductive pastes 68, 70 simultaneously onto the die pad 16 through the nozzles 86a and 86b.

After the insulative and conductive pastes 68, 70 have been disposed on the die pad 16 in the matrix pattern, the semiconductor chip 18 is placed over the paste lumps 68 and 70 to spread them, as shown by a dot-dot-dash line in FIG. 2. Subsequently, it is heated to cure the pastes 68 and 70 to form the adhesive layer 62 including the insulative and conductive adhesive regions 64, 66. As a result, the semiconductor chip 18 is adhered to the die pad 16. Thereafter, the electrode (pad) portion of the semiconductor chip 18 is wire-bonded to the circuit pattern on the top face of the printed board 14 through the gold wires 22. The semiconductor chip 18 is then sealed by the sealing resin 24. Finally, the circuit pattern on the bottom face of the printed board is connected to the solder balls 12.

Thus, the semiconductor device 60 of the first embodiment comprises the adhesive layer 62 for fixedly mounting the semiconductor chip 18 on the die pad 16, the adhesive layer 62 consisting of the insulative and conductive adhesive regions 64, 66. Therefore, the semiconductor chip 18 is firmly adhered to the die pad 16 through the insulative adhesive regions 64 containing no filler, and the semiconductor chip 18 can be prevented from being separated from the die pad 16. In addition, the conductive adhesive regions 66 ensures that the electrical connection is formed between the semiconductor chip 18 and the die pad 16 and that the heat from the semiconductor chip 18 is rapidly transmitted to the die pad 16. Accordingly, the semiconductor device 60 can be superior in thermal conductivity and dissipation. When the insulative and conductive pastes 68, 70 respectively forming the insulative and conductive adhesive regions 64, 66 are alternatively arranged in the matrix pattern, the semiconductor chip 18 can provide an entirely uniform and strong adhesive force. At the same time, the heat dissipation can be uniform in the semiconductor chip 18 without disturbance in operation.

Figure 4:
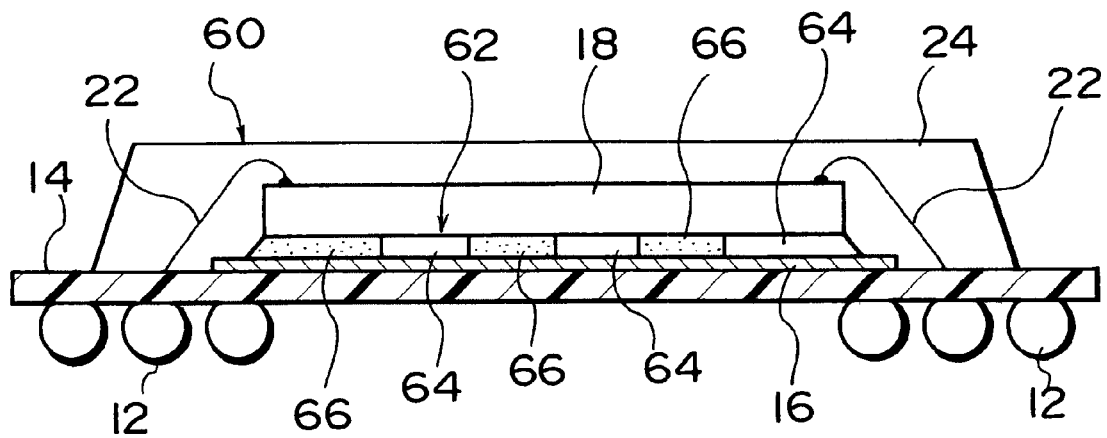
FIG. 4 is a cross-sectional view of a modification of the first embodiment of the semiconductor device.
Figure 5:
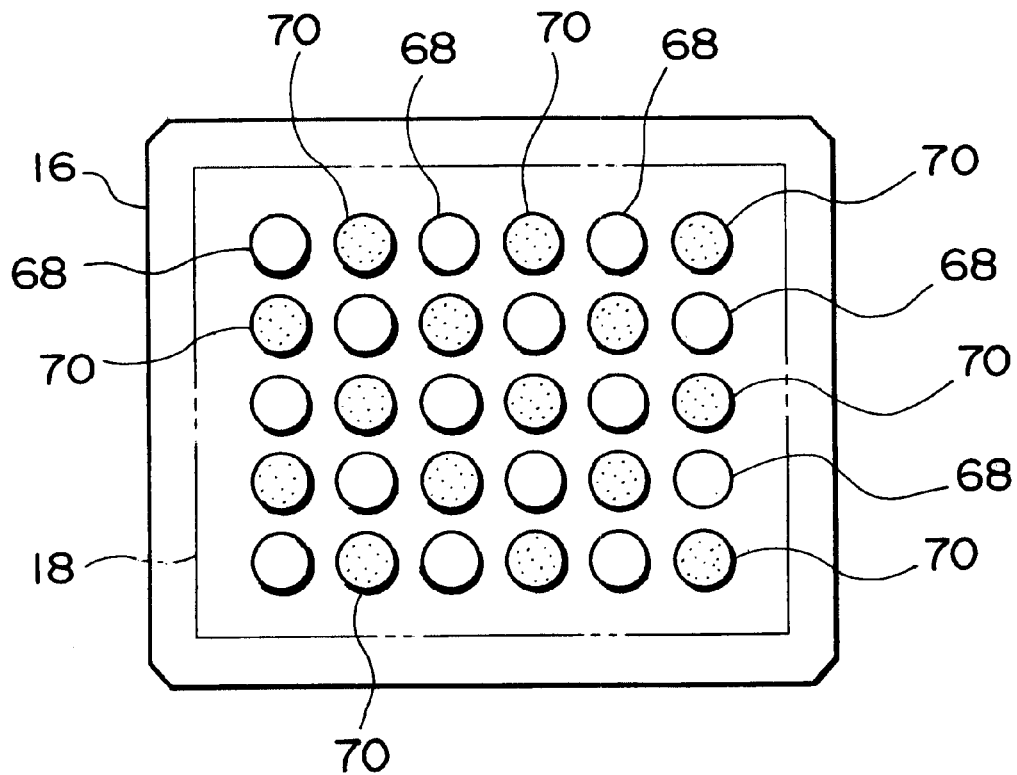
FIG. 5 is a plan view illustrating the arrangement of insulative and conductive pastes in the modified semiconductor device of FIG. 4.

FIG. 4 is a cross-sectional view of a modification of the first embodiment while FIG. 5 is a plan view illustrating the arrangement of insulative and conductive paste lumps. In this modification, as shown in FIG. 5, the semiconductor chip 18 is of a rectangular configuration. The insulative and conductive paste lumps 68, 70 respectively forming the insulative and conductive adhesive regions 64, 66 are reduced in size and thus increased in number. The same number of the insulative and conductive paste lumps 68, 70 are alternately arranged in a matrix pattern. The insulative and conductive adhesive regions 64, 66 forming the adhesive layer 62 shown in FIG. 4 are equal in number to each other, resulting in their proportion of about 1:1. In such an arrangement, the uniformity of the adhesion, electrical conductivity and thermal conductivity of the semiconductor chip 18 can be improved when it is located within a reduced area.

Figure 6:
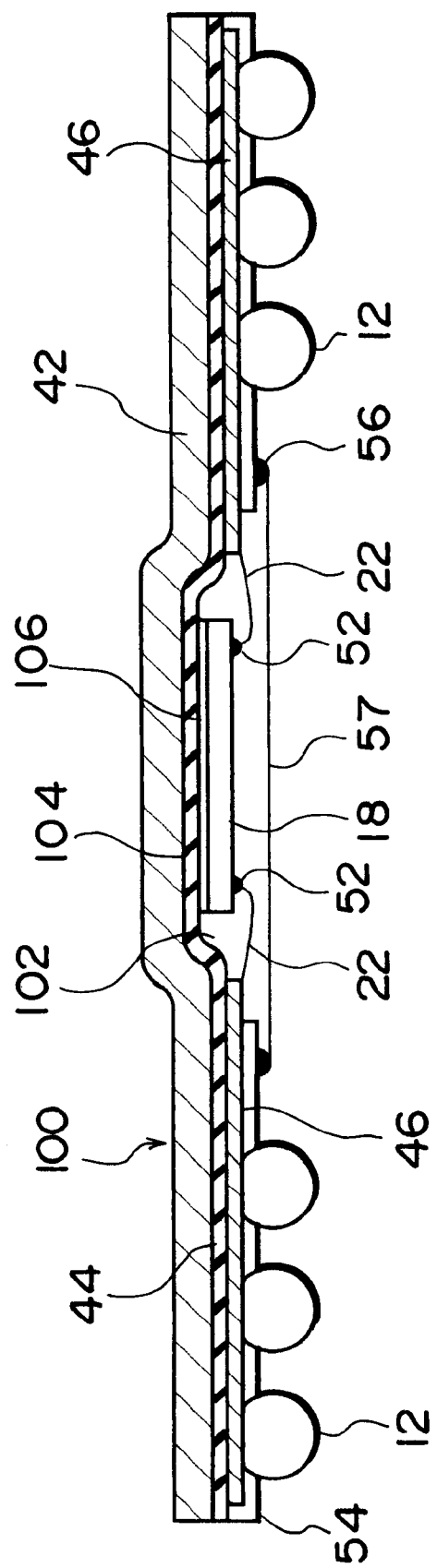
FIG. 6 is a cross-sectional view of the second embodiment of the semiconductor device according to of the present invention.

Although this embodiment has been described as to the simultaneous injection of the insulative and conductive pastes 68, 70, any one of these pastes may previously be formed. Although the preset embodiment has been further described as to the matrix arrangement of the insulative and conductive paste lumps 68, 70 through the nozzles 86, the present invention may similarly be applied to such a case where the pastes are applied on a transfer plate into thin films, the applied pastes being then transferred and applied to the die pad 16 by the use of transfer needles. Although this embodiment has been further described as to the printed board 14 on which the semiconductor chip 18 is mounted, the semiconductor chip 18 may be mounted on or adhered to a metal plate such as copper plate, as shown in FIG. 6. Although FIG. 2 illustrates the alternate arrangement of four insulative paste lumps 68 and five conductive paste lumps 70, two insulative paste lumps and two conductive paste lumps may alternately be arranged. Although the present embodiment has been further described as to the proportion of the insulative adhesive regions 64 to the conductive adhesive regions 66 that is equal to about 1:1, such a proportion may be varied, for example, 60–70% of the conductive adhesive regions 66 and 40–30% of the insulative adhesive regions 64, when it is desired to ensure more electrical and thermal conduction.

Second Embodiment

FIG. 6 is a cross-sectional view of the second embodiment of the semiconductor device. The semiconductor device 100 uses a copper plate 42 as a package board on which a semiconductor chip 18 is mounted. Such a copper plate 42 is C1220-(½) H or C1220-H of phosphor deoxidized copper defined by JIS. An insulative film 44 as made of polyimide is located entirely over one side of the copper plate 42 (bottom face as viewed in FIG. 6). The bottom face of the insulative film 44 includes a circuit pattern 46 formed thereon with insulation between the copper plate 42 and the circuit pattern 46. The copper plate 42 further includes a central receiving recess 102 formed therein through drawing, and the receiving recess 102 receives the semiconductor chip 18. The inner bottom of the receiving recess 102 includes an insulative film 44 formed thereon, which provides a thermal stress relaxation portion (or layer) 104. The semiconductor chip 18 is fixedly mounted on the thermal stress relaxation portion 104 through an adhesive layer 106.

In the resulting semiconductor device 100, the thermal stress relaxation portion 104 can absorb and relax the thermal stress produced due to the difference in thermal expansion coefficient between the semiconductor silicon chip 18 and the copper plate 42 when the solder balls 12 is reflowed, the thermal stress acting on the adhesive layer 106. Thus, the adhesive layer 106 can be prevented from being destroyed to separate the semiconductor chip 18 from the copper plate 42. Since it is not required to remove the insulation film portion corresponding to the receiving recess 102, the number of steps can be reduced. In the second embodiment, the copper plate 42 can be made thinner to reduce the thickness of the entire semiconductor device 100 since the copper plate 42 is formed of C1220-(½) H or C1220-H defined by JIS.

More particularly, C1220-(½)H has its rigidity higher than that of the conventional C1220-(¼)H. The prior art had to use the copper plate 42 having its thickness equal to 0.4 mm or more to avoid any deformation. However, the semiconductor device 100 of the second embodiment can use the copper plate 42 having its thickness equal to 0.3 mm. This can reduce the thickness of the entire semiconductor device 100. Since the rigidity of the copper plate 42 is large sufficient to provide less deformation, the solder balls 12 can be uniform in height, easily ensuring a so-called coplanarity. When the copper plate 42 is made of C1220-H having its increased rigidity, the thickness of the copper plate 42 may be 0.2 mm. This can further reduce the thickness of the semiconductor device 100.

In the semiconductor device 100, the semiconductor chip 18 is connected to the circuit pattern 46 formed on the surface of the insulating film 44 through gold wires 22. The circuit pattern 46 includes a solder resist layer 54 for protecting the surface thereof. The part of the solder resist layer 54 surrounding the receiving recess 102 is formed with an outwardly extending dam 56. This dam 56 functions to prevent a liquid sealing resin 57 for sealing the semiconductor chip 18 from flowing out of the receiving recess 102 when the sealing resin 57 is filled in the receiving recess 102. The sealing resin 57 is then thermally cured to seal the semiconductor chip 18. Solder balls 12 used as external electrodes are welded to the circuit pattern 46 at appropriate locations.

The semiconductor device 100 can be produced as follows. First, the insulating film 44 is formed over the entire surface of the copper plate 42 on one side (bottom face as viewed in FIG. 6). A copper foil is then formed on the surface of the insulative film 44 through vapor deposition or the like. The copper foil is then etched to form a given circuit pattern 46. A solder resist is applied to the surface of the circuit pattern 46. After been cured, the solder resist is etched to expose the desired parts of the circuit pattern 46. At this time, the part of the insulative film 44 corresponding to the receiving recess 102 is also removed. Thereafter, the receiving recess 102 is formed in the copper plate 42 through the well-known drawing process. The semiconductor chip 18 is then firmly adhered to the receiving recess 102 through the adhesive layer 106. Furthermore, the electrode (pad) portion 52 of the semiconductor chip 18 is wire-bonded to the circuit pattern 46. The semiconductor chip 18 is sealed by the sealing resin 57 before the solder balls 12 are welded to the circuit pattern 18. Since the semiconductor chip 18 is fixedly mounted on the substrate made of the copper plate 42, this semiconductor device 100 can provide a very improved heat radiation to the semiconductor chip 18. Even if the semiconductor chip 18 produces more heat, the operation thereof can be stable.

Third Embodiment

Figure 7:
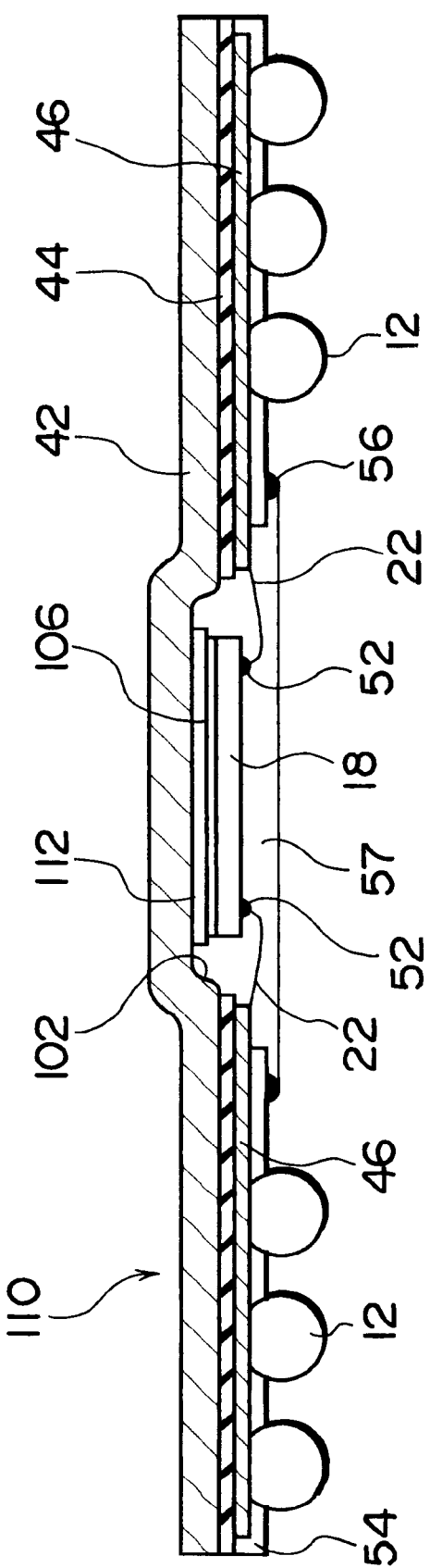
FIG. 7 is a cross-sectional view of the third embodiment of the semiconductor device.

FIG. 7 is a cross-sectional view of the third embodiment of the semiconductor device, in which the thermal stress relaxation layer is formed of solder resist film. In the third embodiment, the insulating film 44 is removed from the receiving recess 102 formed in the copper plate 42. Instead of the insulating film 44, a solder resist film 112 serving as a thermal stress relaxation layer is located on the inner bottom of the receiving recess 102. A semiconductor chip 18 is fixedly mounted on the solder resist film 112 through an adhesive layer 106. Such a semiconductor device 110 can be obtained as follows. First, an insulative resin such as polyimide is applied over the entire surface of a copper plate 42 on one side into a uniform thickness. The insulative resin is then cured to form an insulating film 44. Thereafter, a copper foil layer is formed on the surface of the insulating film 44 through vapor deposition or plating. The copper foil layer is then etched to form a given circuit pattern 46. At this time, the part of the insulating film 44 corresponding to the receiving recess 102 is cut away or removed by etching. Subsequently, a solder resist is applied over the circuit pattern 46 and the part of the copper plate 42 corresponding to the receiving recess 102, After cured, the solder resist is etched to remove the desired parts and to expose the necessary parts of the circuit pattern 46. At the same time, a solder resist film 112 forming the thermal stress relaxation layer is formed. The exposed circuit pattern 46 is plated with nickel and gold. It is then pressed to form the receiving recess 102.

Thereafter, the semiconductor chip 18 is firmly adhered to the solder resist film 112 through the adhesive layer 106. The electrode (pad) portion 52 of the semiconductor chip 18 is wire-bonded to the circuit pattern 46. A dam 56 is formed on the part of the solder resist layer 54 surrounding the receiving recess 102. A liquid sealing resin 57 is then filled in the receiving recess 102 and cured to seal the semiconductor chip 18. Thereafter, solder balls 12 formed into a predetermined size are picked through vacuum suction. A flux is applied to the tip of each of the picked solder balls 12 which are in turn located on the circuit pattern 46 at given locations. Subsequently, it is placed in a reflow furnace to weld the solder balls 12 to the circuit pattern 46.

Fourth Embodiment

Figure 8A:
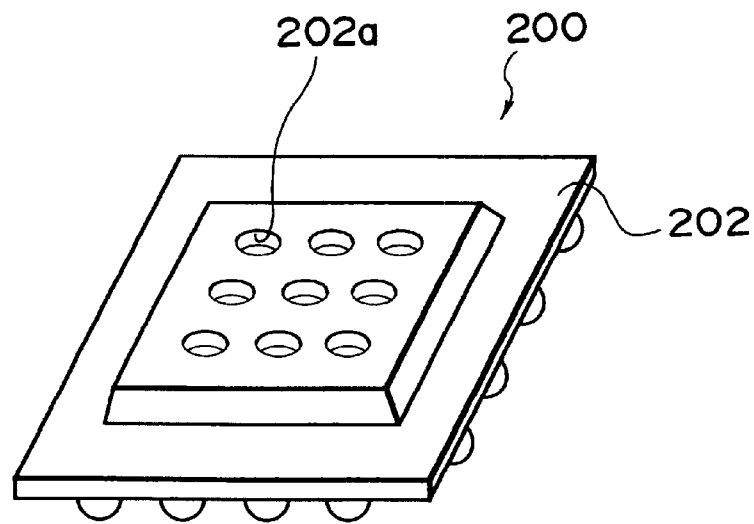
FIGS. 8A and 8B illustrate the fourth embodiment of the semiconductor device.
Figure 8B:
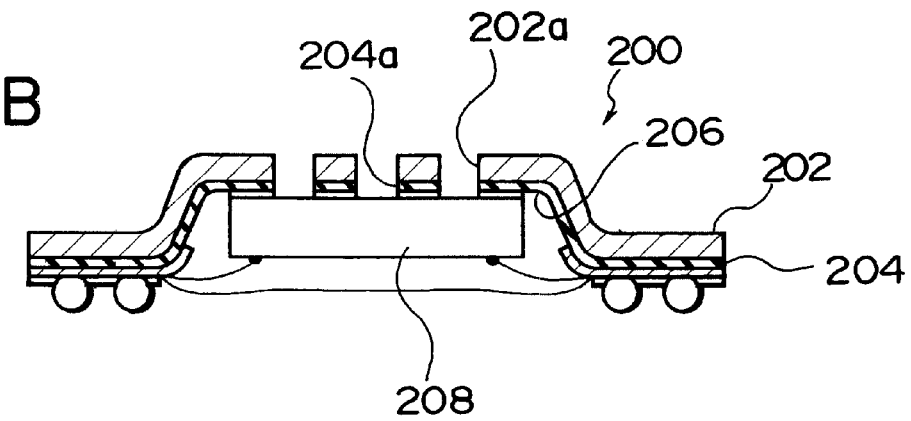

FIG. 8A is a perspective view of the fourth embodiment of the semiconductor device, while FIG. 8B is a cross-sectional view of this semiconductor device. The semiconductor device 200 is characterized by that copper package board 202 and insulating film 204 each includes a plurality of holes 202a or 204a formed therethrough.

More particularly, the package board 202 has a receiving recess 206 formed therein which includes a plurality of holes 202a formed therethrough at the part for receiving a semiconductor chip 208. The insulating film 204 also includes a plurality of holes 204a formed therethrough to communicate with the respective holes 202a.

In such an arrangement, the contact area between the semiconductor chip 208 and the receiving recess 206 is reduced in the presence of the holes 202a and 204a. Thus, the stress caused due to the difference in thermal expansion coefficient between the package board 202 and the semiconductor chip 208 is less transmitted to the semiconductor chip 208. This prevents the semiconductor chip 208 from being separated or from being cracked.

Fifth Embodiment

Figure 9A:
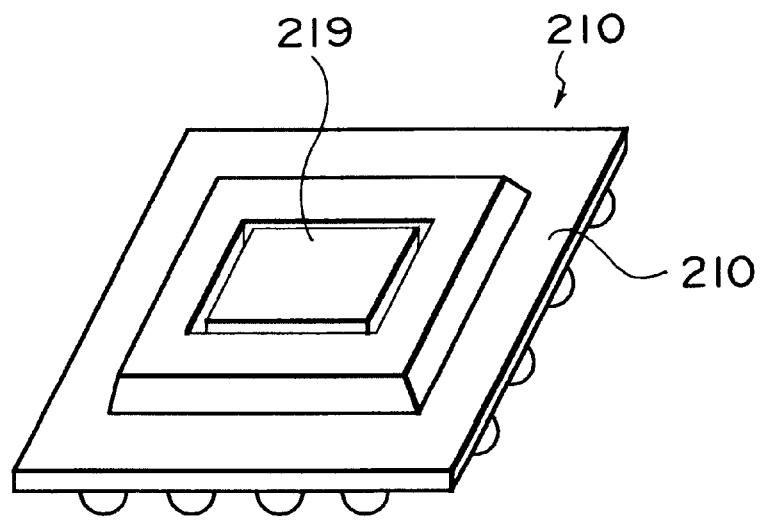
FIGS. 9A and 9B illustrate the fifth embodiment of the semiconductor device.
Figure 9B:
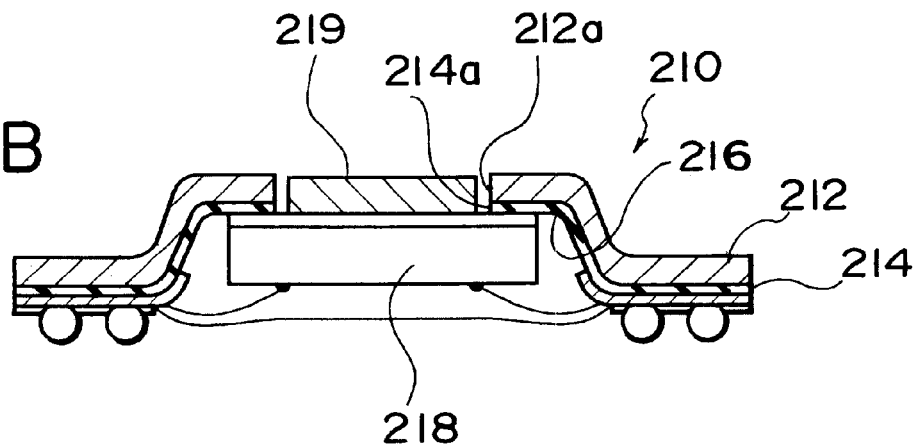

FIG. 9A is a perspective view of the fifth embodiment of the semiconductor device, while FIG. 9B is a cross-sectional view thereof. The semiconductor device 210 comprises a package board 212 and an insulating film 204, each of which includes a hole 212a or 214a formed therethrough. More particularly, the hole 212a is formed through the receiving recess 216 of the package board 212 at the part thereof on which the semiconductor chip 218 is fixedly mounted. The insulating film 214 also includes the hole 214a formed therethrough to communicate with the hole 212a.

Each of the holes 212a and 214a has a size slightly smaller than that of the part of the receiving recess 216 on which the semiconductor chip 218 is mounted. Thus, the edge of the package board 212 forming the hole 212a is fixedly connected to the outer periphery of the semiconductor chip 218 through the insulating film 214. Therefore, the stress due to the difference in thermal expansion coefficient between the package board 212 and the semiconductor chip 218 is much less transmitted to the semiconductor chip 218. If the package board 212 is formed of iron having its thermal expansion coefficient lower than that of the copper, the stress in the semiconductor chip 218 can further be reduced.

The surface of the semiconductor chip 218 exposed through the holes 212a and 214a firmly supports a heat radiating plate 219 made of copper. Thus, the heat in the semiconductor chip 218 can more easily be radiated. In such a case, the stress in the semiconductor chip 218 will not increase in the presence of the heat radiating plate 219 smaller than the semiconductor chip 218 even though the heat radiating plate 219 is mounted inside the hole 212a. The stress in the semiconductor chip 218 can be reduced even if the heat radiating plate 219 is formed of copper having its higher heat conductivity.

Sixth Embodiment

Figure 10:
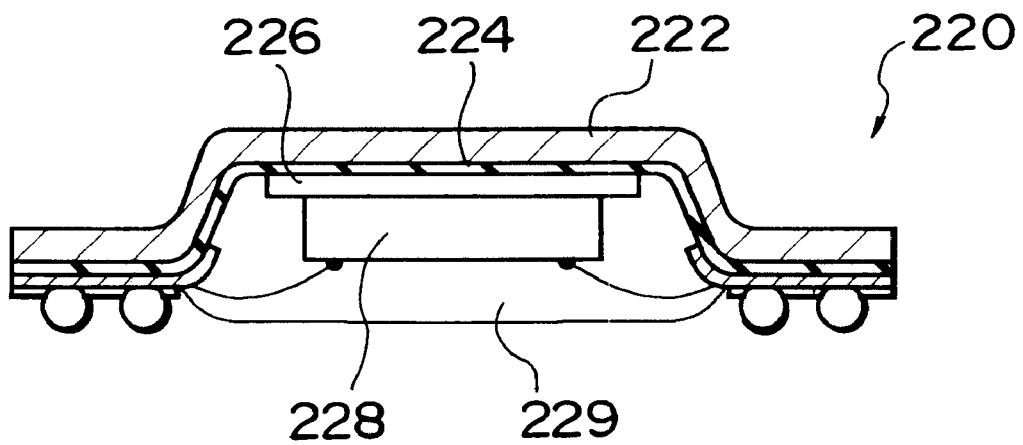
FIG. 10 is a view illustrating the sixth embodiment of the semiconductor device.

FIG. 10 is a cross-sectional view of the sixth embodiment of the semiconductor device. The semiconductor device 220 comprises a package board 222, a semiconductor chip 228 and an adhesive layer 226 for firmly bonding the semiconductor chip 228 to the package board 222. The adhesive layer 226 is formed of the same material as that of a sealing section 229 for sealing the semiconductor chip 228. Such a material may be a resin conventionally used to seal the semiconductor chip. An insulating film 224 is formed on the package board 222.

The semiconductor chip 228 is covered with a material forming the sealing section 229, including the part thereof to be connected to the package board 222. Thus, the stress is dispersed from the package board 222 also to the resin forming the sealing section 229. Therefore, the stress in the semiconductor chip 228 is relaxed so that it is prevented from being separated from the package board or being cracked.

Seventh Embodiment

Figure 11:
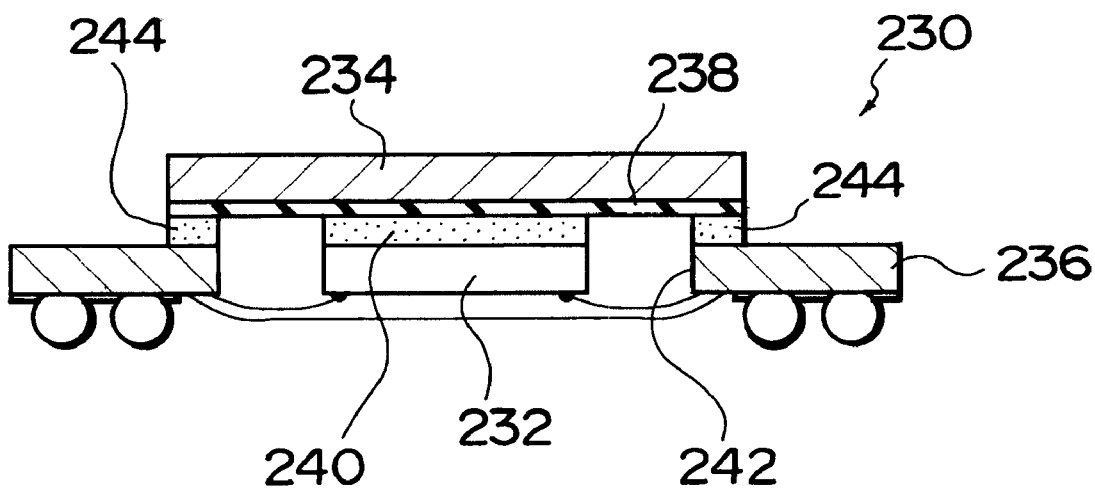
FIG. 11 is a view illustrating the seventh embodiment of the semiconductor device.

FIG. 11 is a cross-sectional view of the seventh embodiment of the semiconductor device. The semiconductor device 230 comprises a semiconductor chip 232, a first package board 234 fixedly mounted on the semiconductor chip 232 and a second package board 236.

The first package board 234 is formed with an insulating film 238. The semiconductor chip 232 is fixedly mounted on the first package board 234 through a thermally conductive adhesive layer 240.

The second package board 236 is formed with an opening 242. The semiconductor chip 232 is disposed within the opening 242. The first and second package boards 234, 236 are fixedly connected to each other through a thermally conductive adhesive layer 244.

The second package board 236 is formed of a material having its thermal conductivity higher than that of the first package board 234, such as copper. The first package board 234 is formed of a material having its coefficient of thermal expansion lower than that of the second package board 236, such as iron.

In the semiconductor device 230 of the seventh embodiment, the stress in the semiconductor chip 232 can be reduced since the first package board 234 oh which the semiconductor chip 232 is fixedly mounted has its thermal expansion coefficient lower than that of the second package board 236. The heat radiation can be improved since the second package board 236 has its thermal conductivity higher than that of the first package board 2354.

Figure 12:
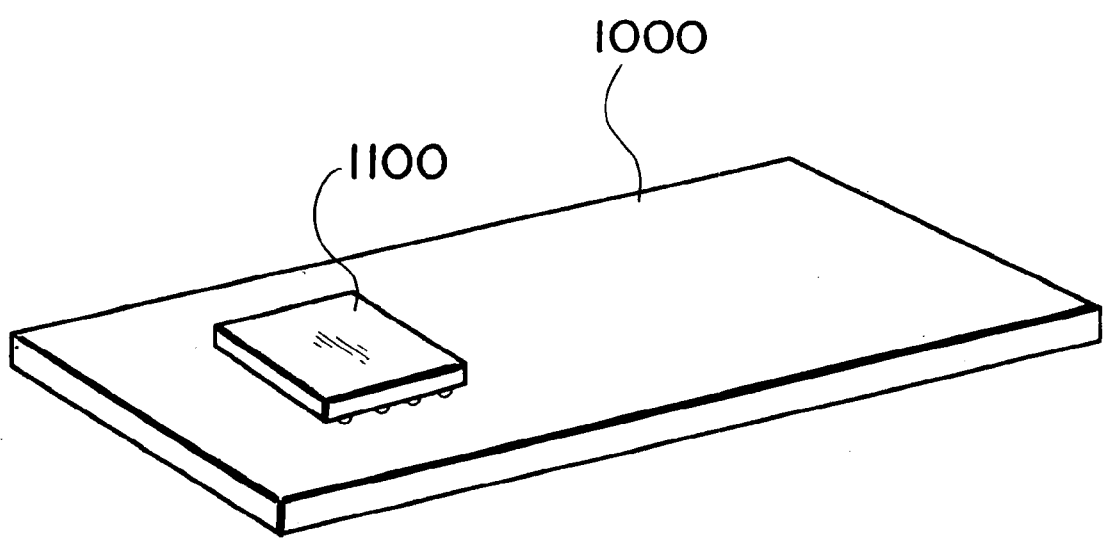
FIG. 12 is a view illustrating a circuit board on which a semiconductor device according to the present invention is mounted.

FIG. 12 shows a circuit board 1000 on which a semiconductor device 1100 according to the present invention is mounted. In general, such a circuit board is formed by an organic system board such as glass-epoxy board. The circuit board may have a given circuit formed by wiring patterns of copper, for example. An electrical connection may be obtained by mechanically connecting these wiring patterns to the bump of the semiconductor device.

Figure 13:
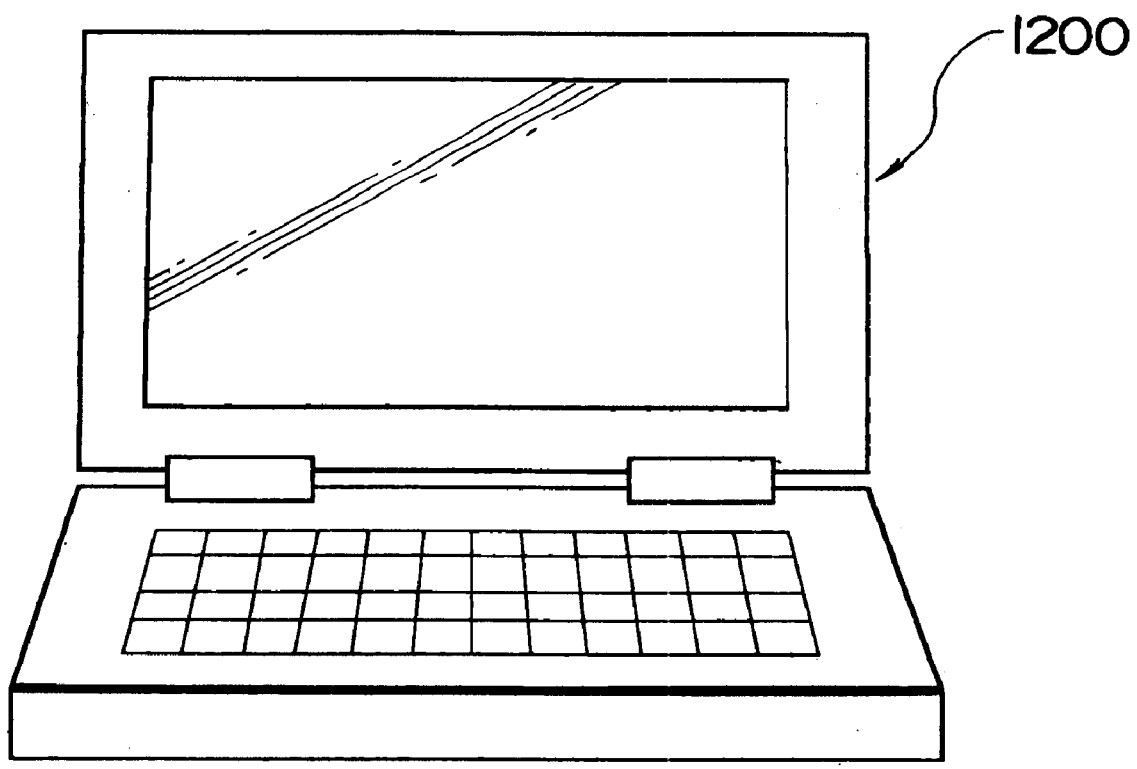
FIG. 13 is a view illustrating an electronic instrument including a circuit board on which a semiconductor device of the present invention is mounted.

A note type personal computer 1200 as an example of the electronic instruments including the circuit board 1000 is shown in FIG. 13.

What is claimed is:

1. A semiconductor device comprising:

a semiconductor chip;

a package board having a fixing region to which the semiconductor chip is fixed, the package board made of material including copper;

a resin for sealing the semiconductor chip, the resin provided on only one side of the package board on which the semiconductor chip is fixed;

an insulating film formed between the semiconductor chip and the package board; and a plurality of external electrodes provided on the package board around the fixing region on the side on which the semiconductor chip is fixed, wherein the package board and the insulating film have a plurality of holes inside the fixing region.

2. A semiconductor device comprising:

a semiconductor chip;

a package board having a hole, the hole being smaller than the plane surface of the semiconductor chip, a portion of the semiconductor chip positioned inside the hole, another portion of the semiconductor chip fixed to the package board, the package board made of a plate having a curved portion to have a recess formed therein, the recess receiving the semiconductor chip;

an insulating film formed between the semiconductor chip and the package board;

a radiator fixed to the semiconductor chip inside the hole and without contact to an opened end of the hole; and a plurality of external electrodes provided at a portion of the package board around the recess.

3. The semiconductor device as defined in claim 2, wherein the package board has a coefficient of thermal expansion lower than the coefficient of thermal expansion of the radiator, and wherein the radiator has a thermal conductivity higher than the thermal conductivity of the package board.

4. The semiconductor device as defined in claim 3, wherein the package board is formed of iron and the radiator is formed of copper.

* * * * *